(12) United States Patent
Jung et al.

(10) Patent No.: US 12,245,392 B2
(45) Date of Patent: Mar. 4, 2025

(54) COVER LAMINATED WITH MULTILAYER FILM, ELECTRONIC DEVICE INCLUDING THE SAME, AND METHOD FOR MANUFACTURING MULTILAYER FILM

(71) Applicant: Samsung Electronics Co., Ltd., Suwon-si (KR)

(72) Inventors: Jeamoon Jung, Suwon-si (KR); Jayeun Ko, Suwon-si (KR); Hokyung Moon, Suwon-si (KR); Taehyun Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 243 days.

(21) Appl. No.: 17/678,915

(22) Filed: Feb. 23, 2022

(65) Prior Publication Data

US 2022/0272856 A1      Aug. 25, 2022

Related U.S. Application Data

(63) Continuation of application No. PCT/KR2022/001230, filed on Jan. 24, 2022.

(30) Foreign Application Priority Data

Feb. 23, 2021   (KR) .................. 10-2021-0024198

(51) Int. Cl.
*H05K 5/03*     (2006.01)
*B32B 15/08*    (2006.01)
(Continued)

(52) U.S. Cl.
CPC .................. *H05K 5/03* (2013.01)

(58) Field of Classification Search
None
See application file for complete search history.

(56) References Cited

U.S. PATENT DOCUMENTS 9,949,397 B2    4/2018   Kim et al.
9,996,201 B2    6/2018   Kim et al.
(Continued)

FOREIGN PATENT DOCUMENTS

EP      3738764 A1      11/2020
JP      2012-234112 A   11/2012
(Continued)

OTHER PUBLICATIONS

International Search Report of the International Searching Authority dated May 13, 2022, in connection with International Application No. PCT/KR2022/001230, 3 pages.
(Continued)

*Primary Examiner* — Frank J Vineis
*Assistant Examiner* — Nicole T Gugliotta

(57) ABSTRACT

Disclosed is an electronic device including a cover defining a portion of an external appearance of the electronic device, a film layer attached to a first surface of the cover, at least one UV molding pattern layer disposed on the film layer, wherein the at least one UV molding pattern layer includes a first area, and a second area that is different from the first area, a thermally cured printing layer disposed on the first area of the at least one UV molding pattern layer, and a deposition layer including a first part disposed to overlap the first area of the at least one UV molding pattern layer, and a second part disposed in the second area of the at least one UV molding pattern layer.

20 Claims, 8 Drawing Sheets

(51) Int. Cl.
    *B32B 15/10*     (2006.01)
    *B32B 27/08*     (2006.01)
    *B32B 27/12*     (2006.01)
    *C08J 7/04*     (2020.01)
    *H04M 1/02*     (2006.01)

(56) References Cited

U.S. PATENT DOCUMENTS

| | | |
|---|---|---|
| 10,203,724 B2 | 2/2019 | Yoon et al. |
| 10,474,303 B2 | 11/2019 | Kim et al. |
| 2013/0223016 A1 | 8/2013 | Kim et al. |
| 2015/0212626 A1 | 7/2015 | Kim et al. |
| 2017/0049000 A1* | 2/2017 | Kang .................... A45C 11/00 |
| 2017/0106632 A1 | 4/2017 | Noda et al. |
| 2018/0260055 A1 | 9/2018 | Kim et al. |
| 2019/0071764 A1* | 3/2019 | Oh .......................... H05K 5/03 |
| 2019/0215974 A1* | 7/2019 | Shim .................. H04M 1/0283 |
| 2021/0078286 A1 | 3/2021 | Lee |
| 2021/0347145 A1 | 11/2021 | Bang et al. |

FOREIGN PATENT DOCUMENTS

| | | |
|---|---|---|
| KR | 10-1277727 B1 | 6/2013 |
| KR | 10-1440081 B1 | 9/2014 |
| KR | 10-2016-0114426 A | 10/2016 |
| KR | 20160136929 A | 11/2016 |
| KR | 10-1954233 B1 | 3/2019 |
| KR | 10-1986055 B1 | 6/2019 |
| KR | 10-2020-0034355 A | 3/2020 |
| KR | 10-2020-0144273 A | 12/2020 |

OTHER PUBLICATIONS

Supplementary European Search Report dated Jun. 6, 2024, in connection with European Patent Application No. 22759920.6, 9 pages.

\* cited by examiner

COVER LAMINATED WITH MULTILAYER FILM, ELECTRONIC DEVICE INCLUDING THE SAME, AND METHOD FOR MANUFACTURING MULTILAYER FILM

CROSS-REFERENCE TO RELATED APPLICATIONS

This application is a continuation of International Application No. PCT/KR2022/001230 designating the United States, filed on Jan. 24, 2022, in the Korean Intellectual Property Receiving Office and claiming priority to Korean Patent Application No. 10-2021-0024198, filed on Feb. 23, 2021, in the Korean Intellectual Property Receiving Office, the disclosures of which are incorporated by reference herein in their entireties.

BACKGROUND

1. Field

Embodiments disclosed in the disclosure relate to a cover laminated with a multilayer film, an electronic device including the same, and a method for manufacturing a multilayer film.

2. Description of Related Art

To give design effects, layers having various colors and three-dimensional patterns may be disposed on a rear surface of a cover that defines an external appearance of an electronic device. For example, a printing layer and an ultraviolet (UV) molding pattern layer laminated on the printing layer may be disposed on the rear surface of the cover. In an example, a color may be implemented through a printing layer, and a visual three-dimensional effect may be implemented through a UV molding pattern layer.

To cure the UV molding pattern layer, light energy of a specific value or more may be required. Furthermore, in order for the light irradiated to a printing layer to reach the UV molding pattern layer, the printing layer may require a specific light transmittance.

Accordingly, a color of a high light transmittance has to be applied to the printing layer, and a visual effect that may be implemented also may be limited. For example, when light transmittance is high, it is difficult to implement high colorfulness.

An aspect of the disclosure provides an electronic device including a multilayer film that may implement various visual effects (e.g., a prism effect) together with various colors (e.g., a white color or a black color of a high purity or a color of a high colorfulness).

SUMMARY

According to an aspect of the disclosure, an electronic device includes a cover forming a portion of an exterior of the electronic device, a film layer attached to a first surface of the cover, at least one UV molding pattern layer disposed on the film layer, wherein the at least one UV molding pattern layer includes a first area, and a second area that is different from the first area, a thermally cured printing layer disposed on the at least one UV molding pattern layer in the first area, and a deposition layer including a first part disposed to overlap the first area of the at least one UV molding pattern layer, and a second part disposed on the at least one UV molding pattern layer in the second area.

According to an aspect of the disclosure, a cover of an electronic device includes a film layer attached to a first surface of the cover, an adhesive layer interposed between the first surface of the cover and the film layer, at least one UV molding pattern layer disposed on the film layer, wherein the at least one UV molding pattern layer includes a first area, and a second area that is different from the first area, a thermally cured printing layer disposed on the at least one UV molding pattern layer in the first area, a deposition layer including a first part disposed to overlap the first area of the at least one UV molding pattern layer, and a second part disposed on the at least one UV molding pattern layer in the second area, and a printing layer disposed on the deposition layer.

According to an aspect of the disclosure, a method for manufacturing a multilayer film includes forming a first UV molding pattern layer on a film layer, wherein the first UV molding pattern layer includes a first area and a second area that is different from the first area, forming a thermally cured printing layer on the first UV molding pattern layer in the first area, and forming a second UV molding pattern layer or a first deposition layer on the thermally cured printing layer and one the first UV molding pattern layer in the second area.

According to the disclosure, various colors and visual effects may be implemented through a multilayer film having areas of different optical characteristics.

According to the disclosure, a dual molding effect may be implemented by laminating the two UV molding pattern layers by using the thermally cured printing layer.

According to the disclosure, manufacturing costs may be reduced by omitting a deposition process formed between the two UV molding pattern layers.

In addition, the disclosure may provide various effects that are directly or indirectly recognized.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

With regard to description of drawings, the same or similar components may be marked by the same or similar reference numerals.

DETAILED DESCRIPTION

FIGS. 1A through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. Accordingly, those of ordinary skill in the art will recognize that modification, equivalent, and/or alternative on the various embodiments described herein can be variously made without departing from the scope and spirit of the disclosure.

Figure 1A:
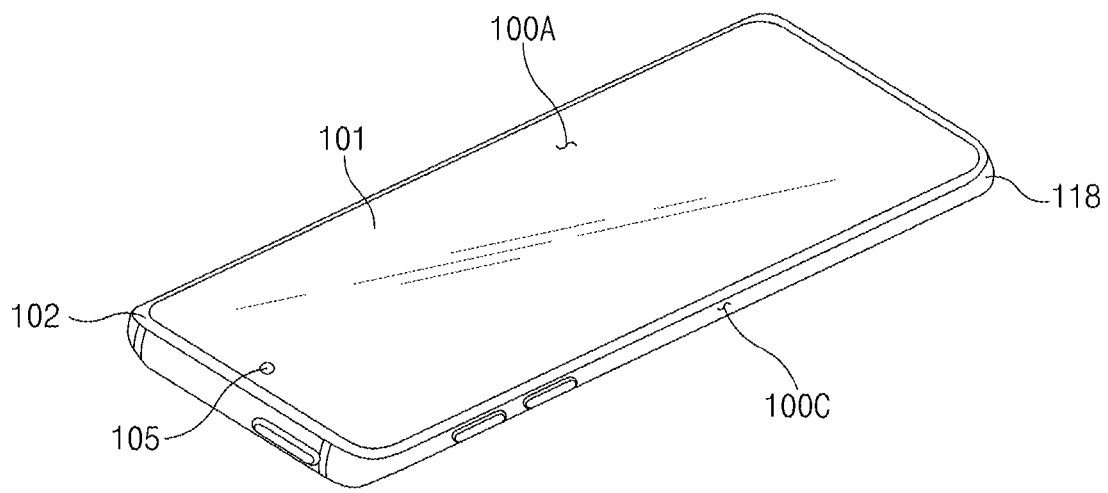
FIG. 1A is a front perspective view of an electronic device according to an embodiment.

FIG. 1A is a front perspective view of an electronic device according to an embodiment.

Figure 1B:
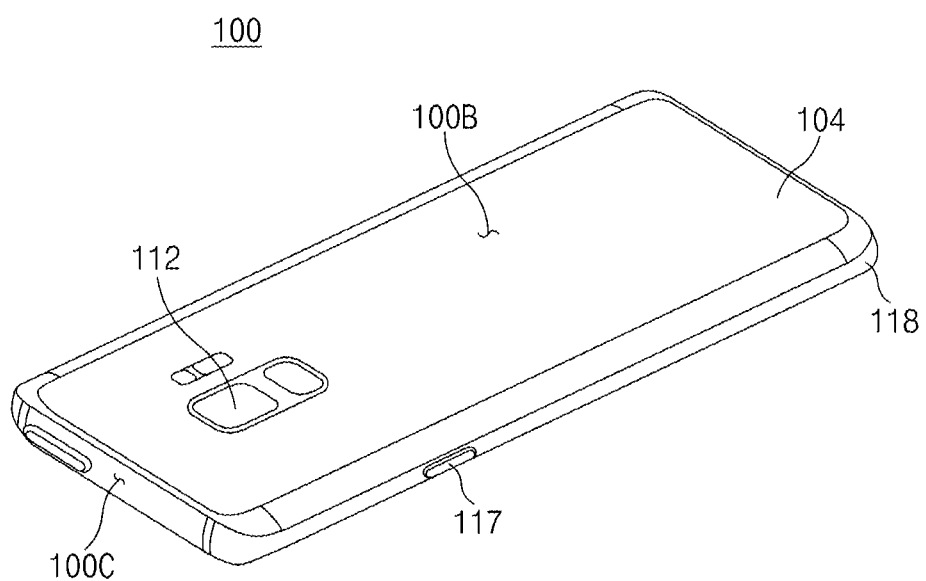
FIG. 1B is a rear perspective view of an electronic device according to an embodiment.

FIG. 1B is a rear perspective view of an electronic device according to an embodiment.

Figure 1C:
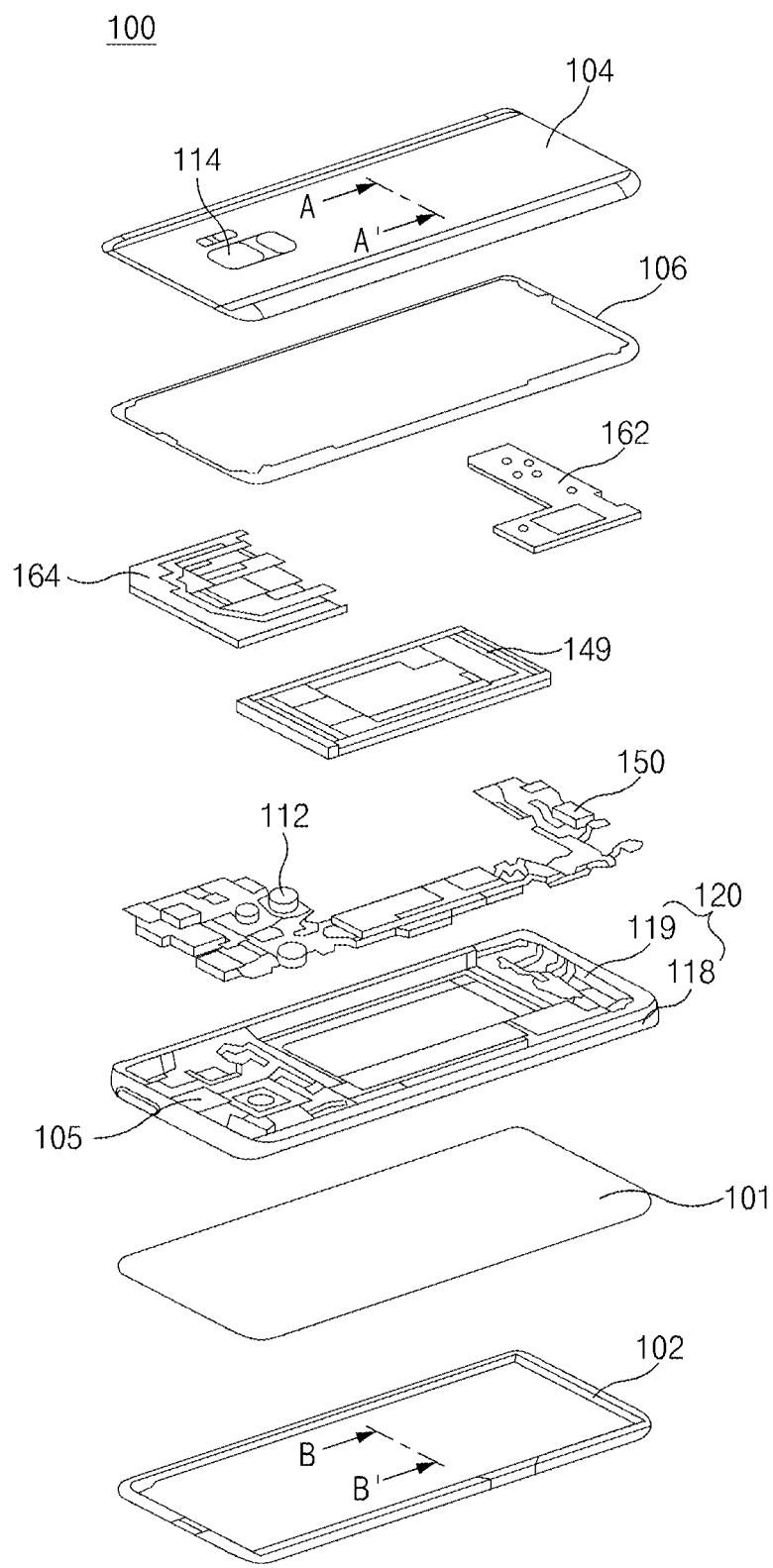
FIG. 1C is an exploded perspective view of an electronic device according to an embodiment.

FIG. 1C is an exploded perspective view of an electronic device according to an embodiment.

Referring to FIGS. 1A and 1B, an electronic device 100 may include a front cover (or "a front plate") 102, a frame structure (or "a side bezel structure") 118, and a rear cover (or "a rear plate") 104. In an embodiment, the electronic device 100 may include a first surface (or a front surface) 100A, a second surface (or a rear surface) 100B, and a side surface 100C surrounding a space between the first surface 100A and the second surface 100B.

In an embodiment, the first surface 100A of the electronic device 100 may be defined by the front cover 102. In an embodiment, the front cover 102 may include a polymer such as a resin and/or glass. In an embodiment, at least a portion of the front cover 102 may be formed to be substantially transparent such that light emitted from a display 101 is visually recognized by a user.

In an embodiment, the second surface 100B of the electronic device 100 may be defined by the rear cover 104. In an embodiment, the rear cover 104, for example, may be formed of glass, ceramics, a resin (e.g., polycarbonate (PC)), a metal (e.g., aluminum, stainless steel (STS), or magnesium), or a combination of at least two of the materials.

In an embodiment, the side surface 100C of the electronic device 100 may be coupled to the front cover 102 and the rear cover 104, and may be defined by the frame structure 118 including a metal and/or a polymer.

In another embodiment, the front cover 102 and/or the rear cover 104 may extend to the frame structure 118 in a form in which an edge portion thereof is deflected and in this case, the front cover 102 and/or the rear cover 104 may define the side surface 100C of the electronic device 100 together with the frame structure 118.

In another embodiment, the rear cover 104 and the frame structure 118 may be integrally formed and may be made of the same material (e.g., a metallic material such as aluminum).

In an embodiment, the front cover 102, the rear cover 104, and the frame structure 118 that define the front surface 100A, the rear surface 100B, and the side surface 100C of the electronic device 100 may be referred to a housing of the electronic device 100. In another embodiment (not illustrated), the housing may refer to a structure that defines some of the first surface 100A, the second surface 100B, and the side surface 100C of FIG. 100.

In an embodiment, the electronic device 100 may include the display 101 (e.g., a display module 660 of FIG. 6), camera modules 105 and 112 (e.g., a camera module 680 of FIG. 6), and a key input device 117.

In an embodiment, the display 101 may be exposed through an entire portion of the front cover 102. For example, at least a portion of the display 101 may be exposed through the front cover 102 that defines the first surface 100A.

In an embodiment, corners of the display 101 may have a shape that is substantially the same as the adjacent outer shape of the front cover 102. In other embodiments, in order to expand the area, by which the display 101 is exposed, the intervals between the outskirts of the display 101 and the outskirts of the front cover 102 may be substantially the same.

In an embodiment, the front surface 100A (or the front cover 102) of the electronic device 100 may include a screen display area that is formed as the display 101 is visually exposed. In an embodiment, the screen display area may include a sensing area (not illustrated) configured to acquire biometric information of a user. Here, the expression that "the screen display areas include a sensing area" may be understood that at least a portion of the sensing area may overlap the screen display areas. For example, the sensing area (not illustrated) may display visual information on the display 101 like other areas of the screen display area, and additionally, may mean an area that may acquire biometric information (e.g., a fingerprint) of the user.

In an embodiment, the display 101 may be coupled to or be disposed to be adjacent to a touch detection circuit, a pressure sensor that may measure the strength (the pressure) of a touch, and/or a digitizer that detects a stylus pen of a magnetic field type.

In an embodiment, the camera modules 105 and 112 may include the first camera module 105 exposed to the front surface 100A of the electronic device 100 and the second camera module 112 exposed to the rear surface 100B.

In an embodiment, the first camera module 105 may be exposed through a portion of the front surface 100A of the display 101. For example, the first camera module 105 may be exposed through a partial area of the front surface 100A through an opening formed at a portion of the display 101.

In an embodiment, the second camera module 112 may include a plurality of camera modules (e.g., a dual camera, a triple camera, or a quad camera). However, the second camera module 112 is not limited to necessarily include a plurality of camera modules, and may include one camera module.

In an embodiment, the first camera module 105 and the second camera module 112 may include one or a plurality of lenses, an image sensor, and/or an image signal processor.

In an embodiment, the key input device 117 may be disposed on the side surface 100C of the electronic device 100. In another embodiment, the key input device 117 of the electronic device 100 may be implemented in another form such as a soft key.

The electronic device according to an embodiment may include an audio module (e.g., a sound output module 655 of FIG. 6), a sensor module (e.g., a sensor module 676), a connector hole, and a light emitting element, which are not illustrated.

In an embodiment, the audio module including a microphone and a speaker may acquire sound on an outside of the electronic device 100 or output sound to the outside of the electronic device 100.

In an embodiment, the sensor module may generate an electrical signal or a data value corresponding to an operation state of the interior of the electronic device 100 or an environmental state of the outside. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illumination sensor.

In an embodiment, the connector hole, for example, may be disposed on the side surface 100C of the electronic device 100 to accommodate the connector. For example, the connector hole may accommodate a connector (e.g., a USB connector) for transmitting/receiving electric power and/or data to and from an external electronic device, or may accommodate a connector (e.g., an earphone jack) for transmitting/receiving an audio signal to and from the external electronic device.

In an embodiment, the electronic device 100 may include a light emitting element. For example, the light emitting element may be disposed on the first surface 100A of the electronic device 100. The light emitting element may provide state information on the electronic device 100 in the form of light. In another embodiment, the light emitting element may provide a light source that interworks with an operation of the first camera module 105. For example, the light emitting element may include an LED, an IR LED, and/or a xenon lamp.

Referring to FIG. 1C, the electronic device 100 may include a bracket 120, a battery 149, a printed circuit board 150, a first support member 162, a second support member 164, and an adhesive member 106.

In an embodiment, the bracket 120 may include the frame structure 118 that defines a surface (e.g., a portion of the side surface 100C of FIG. 1A) of the electronic device 100, and a plate structure 119 that extends from the frame structure 118 to an inside of the electronic device 100.

In an embodiment, the plate structure 119 may be located in an interior of the electronic device 100, may be connected to the frame structure 118, or may be integrally formed with the frame structure 118. In an embodiment, the plate structure 119, for example, may be formed of a metallic material and/or a nonmetallic material (e.g., a polymer). The display 101 may be coupled to one surface of the plate structure 119, and the printed circuit board 150 may be coupled to an opposite surface of the plate structure 119.

In an embodiment, a processor (e.g., a processor 620 of FIG. 6), a memory (e.g., a memory 630 of FIG. 6), and/or an interface (e.g., an interface 677 of FIG. 6) may be mounted on the printed circuit board 150. The processor, for example, may include one or more of a central processing unit, an application processor, a graphic processing unit, an image signal processor, a sensor hub processor, or a communication processor. The memory, for example, may include a volatile and/or nonvolatile memory. The interface, for example, may include a high definition multimedia interface (HDMI), a universal serial bus (USB), an SD card interface, and/or an audio interface. The interface, for example, may electrically or physically connect the electronic device 100 to an external electronic device, and may include a USB connector, an SD card/MMC connector, and an audio connector.

In an embodiment, the battery 149 may supply electric power to at least one of the elements of the electronic device 100. For example, the battery 149 may include a primary cell that cannot be recharged, a rechargeable secondary cell, or a fuel cell. In an embodiment, at least a portion of the battery 149 may be disposed on a plane that is substantially the same as that of the printed circuit board 150. In an embodiment, the battery 149 may be integrally disposed in the interior of the electronic device 100 or may be removably disposed to the electronic device 100.

In an embodiment, the first camera module 105 may be disposed in the plate structure 119 of the bracket 120 such that the lens is exposed through a partial area of the front cover 102 (or the front surface 100A of FIG. 1A) of the electronic device 100.

In an embodiment, the second camera module 112 may be disposed in the printed circuit board 150 such that the lens is exposed through a camera area 114 of the rear cover 104 (or the rear surface 100B of FIG. 1B) of the electronic device 100.

In an embodiment, the camera area 114 may be formed on a surface (e.g., the rear surface 100B of FIG. 1B) of the rear cover 104. In an embodiment, the camera area 114 may be formed to be at least transparent enough that external light can reach the lens of the second camera module 112. In an embodiment, at least a portion of the camera area 114 may protrude from the surface of the rear cover 104 by a specific height. However, the embodiment is not limited thereto, and the camera area 114 may define a plane that is substantially the same as the surface of the rear cover 104.

In an embodiment, the first support member 162 and the second support member 164 may be disposed between the rear cover 104 and the printed circuit board 150. In an embodiment, the first support member 162 and the second support member 164 may be coupled to the bracket 120 to cover a partial area of the printed circuit board 150.

In an embodiment, the adhesive member 106 may be interposed between the rear cover 104 and the frame structure 118 to attach the rear cover 104 to the frame structure 118. The adhesive member 106, for example, may include double-sided tape.

Figure 2:
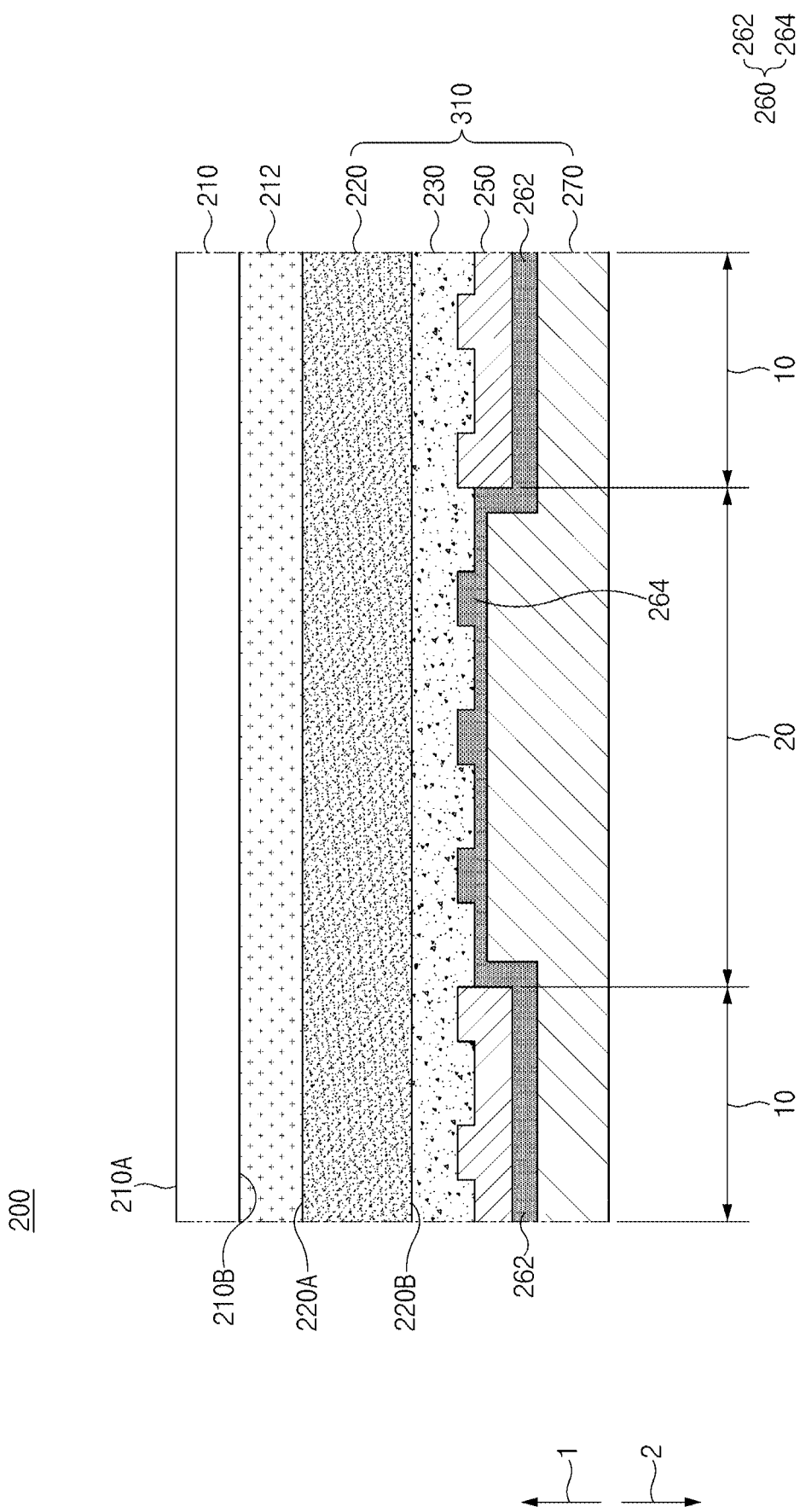
FIG. 2 is a cross-sectional view of an electronic device according to an embodiment.

FIG. 2 is a cross-sectional view of an electronic device according to an embodiment.

FIG. 2 may be a cross-sectional view taken along line A-A' or line B-B' of FIG. 1C.

Figure 3:
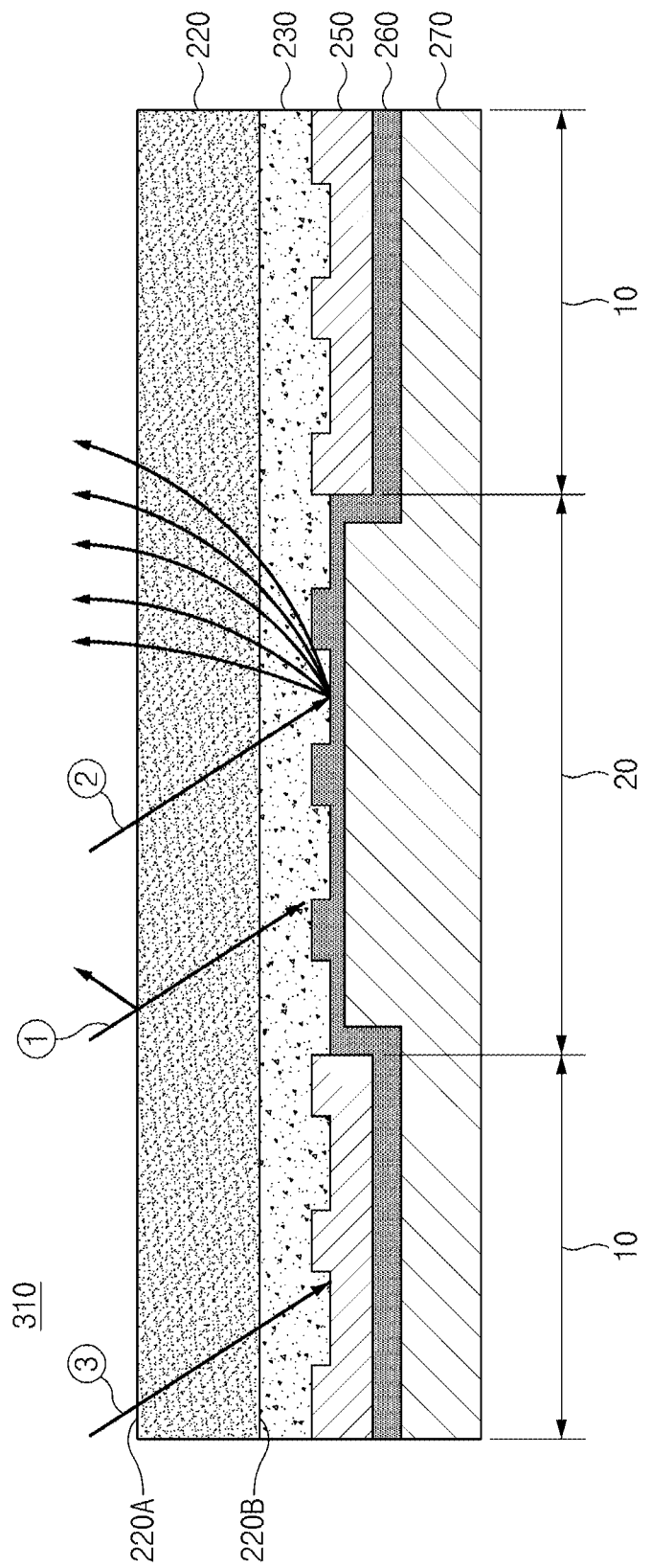
FIG. 3 is a view illustrating optical characteristics of a first multilayer film according to an embodiment.

FIG. 3 is a view illustrating optical characteristics of a first multilayer film according to an embodiment. Thicknesses of layers illustrated in FIGS. 2 and 3 may not be proportional to or may not coincide with actual scales.

Referring to FIGS. 2 and 3, an electronic device 200 (e.g., the electronic device 100 of FIG. 1C) according to an embodiment may include a cover 210 (e.g., the front cover 102 or the rear cover 104 of FIG. 1C), an adhesive layer 212, and a first multilayer film 310.

In an embodiment, the cover 210 may include a first surface 210A that faces a first direction '1', and a second surface 210B that faces a second direction '2'. In an embodiment, the first direction '1' may be a direction oriented towards an outside of the electronic device 200 with respect to the cover 210, and the second direction '2' may be a direction oriented towards an inside of the electronic device 200 with respect to the cover 210. In an embodiment, the first surface 210A of the cover 210 may correspond to the front surface 100A of FIG. 1A or the rear surface 100B of FIG. 1B.

In an embodiment, the first multilayer film 310 may include a base film layer 220, a first UV molding pattern layer 230, a thermally cured printing layer 250, a first deposition layer 260, and a first printing layer 270. In an embodiment, the first multilayer film 310 may be disposed on the cover 210. For example, the first multilayer film 310 may be disposed in the second direction '2' of the cover 210. For example, the first multilayer film 310 may be disposed on the second surface 210B of the cover 210.

In an embodiment, the base film layer 220 may be attached to the second surface 210B of the cover 210. For example, the base film layer 220 may be attached to the cover 210 through the adhesive layer 212 interposed between the cover 210 and the base film layer 220. In an embodiment, the adhesive layer 212, for example, may include an optically clear adhesive (OCA) or an optically clear resin (OCR) having a thickness of about 5 μm to 35 μm.

In an embodiment, the base film layer 220 may be a base layer for forming the first UV molding pattern layer 230. In an embodiment, the base film layer 220 may include a synthetic resin, such as polyethylene terephthalate (PET) or polycarbonate (PC), which is substantially transparent. In an embodiment, the base film layer 220, for example, may have a thickness of about 18 μm to 55 μm.

In an embodiment, the base film layer 220 may be formed to be substantially transparent. In this case, at least a portion of the light (1) input to the base film layer 220 may pass through the base film layer 220.

In another embodiment, a primer layer including a pigment may be formed on a front surface 220A and/or a rear surface 220B of the base film layer 220. In this case, at least a portion of the light (1) incident to the base film layer 220 may be reflected to implement a specific color, and the remaining portions thereof may pass through the base film layer 220.

In an embodiment, the first UV molding pattern layer 230 may be disposed on the base film layer 220 (e.g., in the second direction 2). For example, the first UV molding pattern layer 230 may be disposed on the second surface 220B of the base film layer 220.

In an embodiment, the first UV molding pattern layer 230 may include a pattern (e.g., a convex-concave pattern) of a fine size to give various visual effects. In an embodiment, the first UV molding pattern layer 230 may have a thickness of about 5 μm to about 15 μm.

In an embodiment, a visual effect using properties (e.g., refraction and reflection) of light may be provided through the pattern formed in the first UV molding pattern layer 230. For example, the first UV molding pattern layer 230 may provide a multi-color effect that represents multiple colors by dispersing the input light (2). As another example, the first UV molding pattern layer 230 may provide a scattered reflection effect using scattering of light. As another example, the first UV molding pattern layer 230 may provide a visually three-dimensional feeling (e.g., a depth feeling). In an embodiment, the first UV molding pattern layer 230 may include various patterns according to a visual effect that is to be implemented.

In an embodiment, the first UV molding pattern layer 230 may include a first area 10, and a second area 20 that is different from the first area 10.

In an embodiment, the thermally cured printing layer 250 may be disposed on the first UV molding pattern layer 230 in the first area 10. In an embodiment, the thermally cured printing layer 250 may include polyester/urethane, polyester/epoxy, polyester, acryl/silicon, and/or a combination thereof. In an embodiment, the thermally cured printing layer 250 may have a thickness of about 2 μm to about 10 μm. In an embodiment, the thermally cured printing layer 250 may have a thickness of about 2 μm to about 7 μm.

In an embodiment, the thermally cured printing layer 250 may be substantially opaque. For example, the thermally cured printing layer 250 may absorb and/or reflect the input light (3). In an embodiment, the thermally cured printing layer 250 may be a light transmittance of less than about 1%. In an embodiment, the thermally cured printing layer 250 may be printed by using a mirror ink, a pearl pigment, and a special pigment (e.g., a pigment visually recognized only under a specific lighting) to implement various visual effects as well as a specific opaque color.

When an ultraviolet ray is irradiated in the second direction 2 and another printing layer is disposed between the base film layer 220 and the first UV molding pattern layer 230, the other printing layer may require a specific light transmittance for UV curing of the first UV molding pattern layer 230. Accordingly, a visual effect that may be implemented through the other printing layer may be limited, and the other printing layer may influence UV curing of the first UV molding pattern layer 230. In an embodiment, because the thermally cured printing layer 250 is disposed in the second direction '2' of the first UV molding pattern layer 230, various visual effects may be implemented while a curing performance of the first UV molding pattern layer 230 is not influenced.

In an embodiment, the first deposition layer 260 may include a first part 262 and a second part 264. In an embodiment, the first part 262 may be disposed to at least partially overlap the thermally cured printing layer 250 when viewed from the second direction '2'. In an embodiment, the first part 262 may overlap the first UV molding pattern layer 230 in the first area 10. In an embodiment, the second part 264 may be disposed on the first UV molding pattern layer 230 in the second area 20.

In an embodiment, the first deposition layer 260 may include a metal oxide. In an embodiment, the first deposition layer 260 may be deposited with at least one layer including the metal oxide. For example, the first deposition layer 260 may include a first layer, on which $SiO_2$ is deposited, and a second layer, on which $TiO_2$ is deposited, on the first layer.

In an embodiment, the first deposition layer 260 may maximize the visual effect implemented by the first UV molding pattern layer 230, and may give a metallic texture to the cover 210. In an embodiment, the first deposition layer 260 may have a thickness of about 10 μm to about 700 μm.

In an embodiment, the first printing layer 270 may be disposed on the first deposition layer 260. In an embodiment, the first printing layer 270 may be formed to be substantially opaque, and may shield light such that an interior of the electronic device 200 is not viewed from the outside. In an embodiment, a color of the cover 210 viewed from the outside may be influenced due to a shielding color of the first printing layer 270. For example, the first printing layer 270 may be shield-printed in a white color or a black color for shielding of light after background printing. In this case, light shielding performance becomes more excellent as a lightness of the shied-printing layer of the first printing layer 270 becomes lower, but the lightness and the colorfulness of the color viewed from the outside of the cover 210 and the thermally cured printing layer 250 may become lower. In an embodiment, because the thermally cured printing layer 250 is disposed between the first UV molding pattern layer 230 and the first printing layer 270, an influence due to the lightness of the first printing layer 270 may be reduced. For example, even when the lightness and the colorfulness of the first printing layer 270 are determined to be substantially low to secure the light shielding performance, the colorfulness and the lightness of the color viewed from the outside of the cover 210 and the thermally cured printing layer 250 may not be lowered by the first printing layer 270.

In an embodiment, at least some of the layers of the first multilayer film 310 may have different indices of refraction. For example, the adhesive layer 212 may have an index of refraction of about 1.49. For example, the base film layer 220 may have an index of refraction of about 1.56. For example, the first UV molding pattern layer 230 may have an index of refraction of about 1.58. For example, the first layer of the first deposition layer 260 may have an index of refraction of about 1.48, and the second layer may have an index of refraction of about 2.35. Due to a difference between indices of refraction of interfaces of the first multilayer film 310 according to an embodiment, an amount of reflected light may increase and a color of a high luminance may be implemented. In an embodiment, when the first deposition layer 260 includes a layer having an index of refraction for light of a specific wavelength, a colorfulness implemented by the first multilayer film 310 may be increased.

In an embodiment, the first multilayer film 310 may implement a complex pattern through the first area 10 and the second area 20 having different optical characteristics. For example, because the light input to the first area 10 is absorbed and/or reflected by the thermally cured printing layer 250, the first area 10 may be viewed substantially opaquely. The second area 20, in which the thermally cured printing layer 250 is not disposed, may provide a visual effect implemented by the base film layer 220, the first UV molding pattern layer 230, the first deposition layer 260, and the first printing layer 270. For example, a color (e.g., a color that is close to a primary color, such as red, yellow, and purple) may be implemented in the first area 10 based on a colorfulness or a color (e.g., silver, black, or white) of a high luminance (lightness) by using the substantially opaque thermally cured printing layer 250. The second area 20 may provide a visual effect using refraction, scattering, or interference of light by using the first UV molding pattern layer 230 that is substantially transparent or opaque.

In an embodiment, the electronic device 200 may be provided with an aesthetic aspect through a combination of the first area 10 and the second area 20 with different optical characteristics. For example, when the first multilayer film 310 has a pattern, in which the first area 10 and the second area 20 are alternately disposed, a new visual effect may be provided. In an embodiment, the pattern having the first area 10 and the second area 20 may vary according to a visual effect that is to be implemented.

Figure 4:
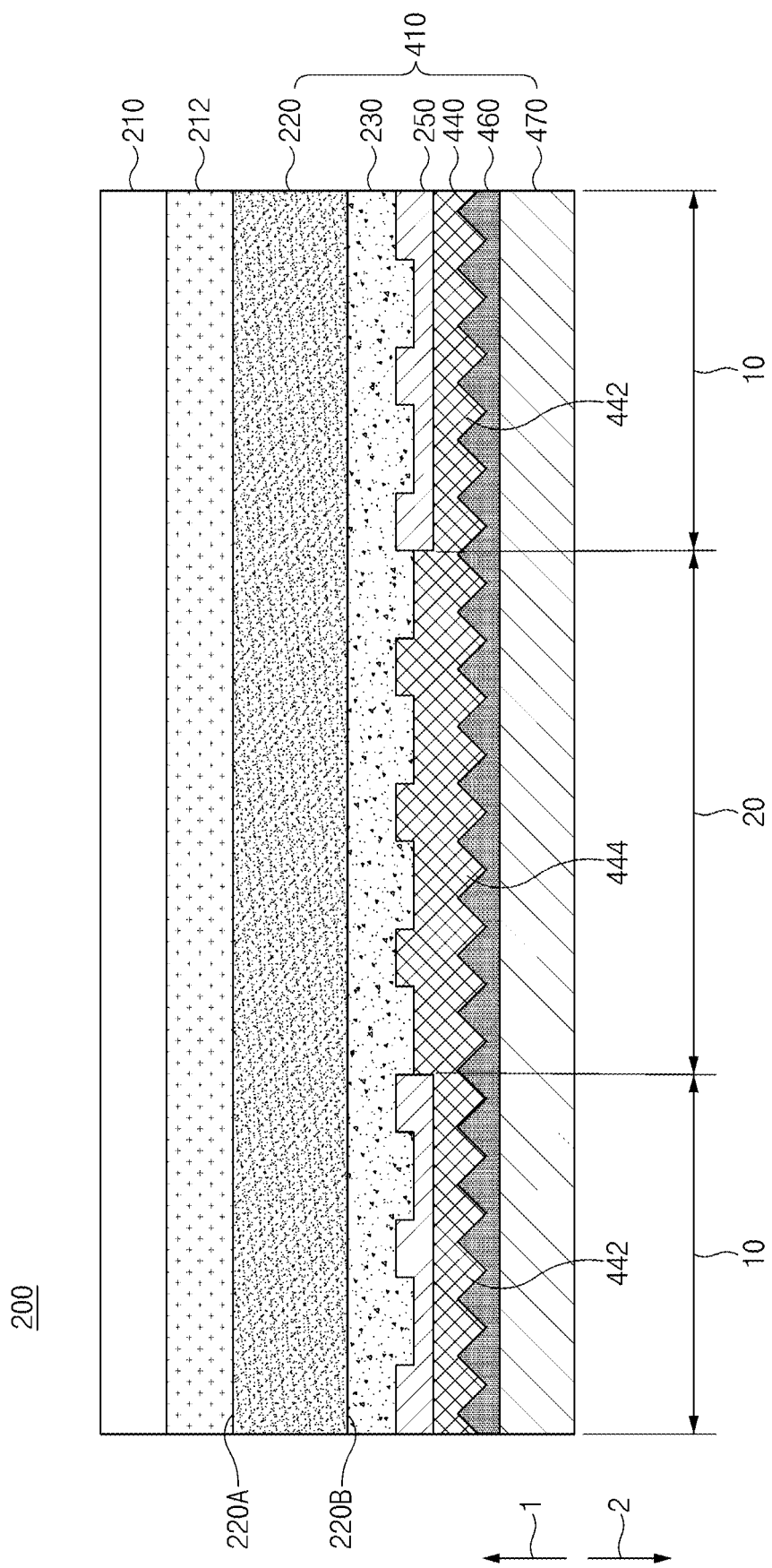
FIG. 4 is a cross-sectional view of an electronic device according to another embodiment.

FIG. 4 is a cross-sectional view of an electronic device according to another embodiment.

FIG. 4 may be a cross-sectional view taken along line A-A' or line B-B' of FIG. 1C. Thicknesses of the layers illustrated in FIG. 4 may not be proportional to or coincide with actual scales. In FIG. 4, a repeated description of configurations having the same reference numerals as the above-described configurations will be omitted.

Referring to FIG. 4, the electronic device 200 according to an embodiment may include a second multilayer film 410.

In an embodiment, the second multilayer film 410 may include a second UV molding pattern layer 440, a second deposition layer 460, and a second printing layer 470.

In an embodiment, the second UV molding pattern layer 440 may include a pattern (e.g., a convexo-concave pattern) of a fine size to give various visual effects.

In an embodiment, the second UV molding pattern layer 440 may include a first part 442 corresponding to the first area 10, and a second part 444 corresponding to the second area 20.

In an embodiment, the first part 442 may be disposed to at least partially overlap the thermally cured printing layer 250 when viewed from the second direction '2'. For example, the first part 442 may be disposed in the second direction '2' of the thermally cured printing layer 250.

In an embodiment, the second part 444 of the second UV molding pattern layer 440 may extend from the first part 442. In an embodiment, the second part 444 may be disposed in the first UV molding pattern layer 230. For example, the second part 444 may be disposed in the second direction '2' of the second area 20 of the first UV molding pattern layer 230.

In an embodiment, the second UV molding pattern layer 440 may have an index of refraction (e.g., about 1.38) that is different from that of the first UV molding pattern layer 230.

In an embodiment, the first UV molding pattern layer 230 and/or the second UV molding pattern layer 440 may be implemented to have a substantially translucent color.

In an embodiment, because the thermally cured printing layer 250 is disposed between the first UV molding pattern layer 230 and the second UV molding pattern layer 440, the first UV molding pattern layer 230 and the second UV molding pattern layer 440 may be laminated on each other while another deposition layer is not interposed therebetween. In an embodiment, more various visual effects may be provided by laminating the two UV molding pattern layers.

In an embodiment, the second deposition layer 460 may be disposed on the second UV molding pattern layer 440. In an embodiment, the second deposition layer 460 may be disposed on the second UV molding pattern layer 440 in the first area 10 and the second area 20. In an embodiment, the description of the first deposition layer 260 may be applied to the second deposition layer 460 in substantially the same way, except for a location of the second deposition layer 460 in the second multilayer film 410. For example, the second deposition layer 460 may include a first part formed on the second UV molding pattern layer 440 in the first area 10, and a second part formed on the second UV molding pattern layer 440 in the second area 20.

In an embodiment, the second printing layer 470 may be disposed on the second deposition layer 460. In an embodiment, the description of the first printing layer 270 of the first multilayer film 310 may be applied to the second printing layer 470 in substantially the same way, except for a location of the second printing layer 470 in the second multilayer film 410.

The electronic device 200 according to an embodiment may include at least one UV molding pattern layer. For example, like the first multilayer film 310 of FIG. 2, the electronic device 200 according to an embodiment may include the first UV molding pattern layer 230. As another example, like the second multilayer film 410 of FIG. 4, the electronic device 200 according to an embodiment may include the first UV molding pattern layer 230 and the second UV molding pattern layer 440.

In an embodiment, because the second UV molding pattern layer 440 includes the first area 10 and the second area 20 that are the same as those of the first UV molding pattern layer 230, the at least one UV molding pattern layer may be understood as including the first area 10 and the second area 20.

The electronic device (e.g., the electronic device 200 of FIG. 2) according to the above-described embodiment may include a cover (e.g., the cover 210 of FIG. 2) defining a portion of an external appearance of the electronic device, a film layer (e.g., the base film layer 220 of FIG. 2) attached to a first surface (e.g., the second surface 210B of FIG. 2) of the cover, at least one UV molding pattern layer (e.g., the first UV molding pattern layer 230 of FIG. 2 and/or the second UV molding pattern layer 440 of FIG. 4) disposed on the film layer, wherein the at least one UV molding pattern layer includes a first area (e.g., the first area 10 of FIG. 1), and a second area (e.g., the second area 20 of FIG. 2) that is different from the first area, a thermally cured printing layer (e.g., the thermally cured printing layer 250 of FIG. 2) disposed on the at least one UV molding pattern layer in the first area, and a deposition layer (e.g., the first deposition layer 260 or the second deposition layer 460 of FIG. 4) including a first part (e.g., the first part 262 of FIG. 2) disposed to overlap the first area of the at least one UV molding pattern layer, and a second part (e.g., the second part 264 of FIG. 2) disposed on the at least one UV molding pattern layer in the second area.

In an embodiment, the thermally cured printing layer may not be disposed on the at least one UV molding pattern layer in the second area.

In an embodiment, the at least one UV molding pattern layer may include a first UV molding pattern layer (e.g., the first UV molding pattern layer 230 of FIG. 2), and the first part of the deposition layer may be formed on the thermally cured printing layer to overlap the first area, and the second part of the deposition layer may be formed on the first UV molding pattern layer in the second area.

In an embodiment, the at least one UV molding pattern layer may include a first UV molding pattern layer (e.g., the first UV molding pattern layer 230 of FIG. 4) and a second UV molding pattern layer (e.g., the second UV molding pattern layer 440 of FIG. 4), and the thermally cured printing layer may be disposed, in the first area, between the first UV molding pattern layer and the second UV molding pattern layer.

In an embodiment, the second UV molding pattern layer may include a first part (e.g., the first part 442 of FIG. 4) corresponding to the first area and disposed on the thermally cured printing layer, and a second part (e.g., the second part 444 of FIG. 4) corresponding to the second area, extending from the first part, and disposed on the first UV molding pattern layer.

In an embodiment, the first part of the deposition layer may be formed on the first part of the second UV molding pattern layer corresponding to the first area, and the second part of the deposition layer may be formed on the second part of the second UV molding pattern layer corresponding to the second area.

In an embodiment, the electronic device may include a printing layer (e.g., the first printing layer 270 of FIG. 2 or the second printing layer 470 of FIG. 4) formed on the deposition layer.

In an embodiment, the electronic device may include an adhesive layer (e.g., the adhesive layer 212 of FIG. 2) interposed between the cover and the film layer.

In an embodiment, a thickness of the first UV molding pattern layer may be in a range from 5 μm to 15 m, a thickness of the second UV molding pattern layer may be in a range from 5 m to 15 μm, a thickness of the thermally cured printing layer may be in a range from 2 μm to 7 μm, a thickness of the deposition layer may be in a range from 10 nm to 700 nm, and a thickness of the printing layer may be in a range from 2 μm to 70 μm.

In an embodiment, the cover may include a resin or glass.

A cover (e.g., the cover 210 of FIG. 2) of the electronic device (e.g., the electronic device 200 of FIG. 2) according to the above-described embodiment may include a film layer (e.g., the base film layer 220 of FIG. 2) attached to a first surface (e.g., the second surface 210B of FIG. 2) of the cover, an adhesive layer (e.g., the adhesive layer 212 of FIG. 2) interposed between the first surface of the cover and the film layer, at least one UV molding pattern layer (e.g., the first UV molding pattern layer 230 of FIG. 2 and/or the second UV molding pattern layer 440 of FIG. 4) disposed on the film layer, wherein the at least one UV molding pattern layer includes a first area (e.g., the first area 10 of FIG. 2), and a second area (e.g., the second area 20 of FIG. 2) that is different from the first area, a thermally cured printing layer (e.g., the thermally cured printing layer 250 of FIG. 2) disposed on the at least one UV molding pattern layer in the first area, a deposition layer (e.g., the first deposition layer 260 of FIG. 2 or the second deposition layer 460 of FIG. 4) including a first part (e.g., the first part 262 of FIG. 2) disposed to overlap the first area of the at least one UV molding pattern layer, and a second part (e.g., the second part 264 of FIG. 2) disposed on the at least one UV molding pattern layer in the second area, and a printing layer (e.g., the first printing layer 270 of FIG. 2 or the second printing layer 470 of FIG. 4) disposed on the deposition layer.

In an embodiment, the thermally cured printing layer may not be disposed on the at least one UV molding pattern layer in the second area.

In an embodiment, the at least one UV molding pattern layer may include a first UV molding pattern layer (e.g., the first UV molding pattern layer 230 of FIG. 2), the first part of the deposition layer may be formed on the thermally cured printing layer to overlap the first area, and the second part of the deposition layer may be formed on the first UV molding pattern layer in the second area.

In an embodiment, the at least one UV molding pattern layer may include a first UV molding pattern layer (e.g., the first UV molding pattern layer 230 of FIG. 4) and a second UV molding pattern layer (e.g., the second UV molding pattern layer 440 of FIG. 4), and the thermally cured printing layer may be disposed, in the first area, between the first UV molding pattern layer and the second UV molding pattern layer.

In an embodiment, the second UV molding pattern layer may include a first part (e.g., the first part 442 of FIG. 4) corresponding to the first area and disposed on the thermally cured printing layer, and a second part (e.g., the second part 444 of FIG. 4) corresponding to the second area, extending from the first part, and disposed on the first UV molding pattern layer.

In an embodiment, the first part of the deposition layer may be formed on the first part of the second UV molding pattern layer corresponding to the first area, and the second part of the deposition layer may be formed on the second part of the second UV molding pattern layer corresponding to the second area.

In an embodiment, the cover may include a resin or glass.

Figure 5:
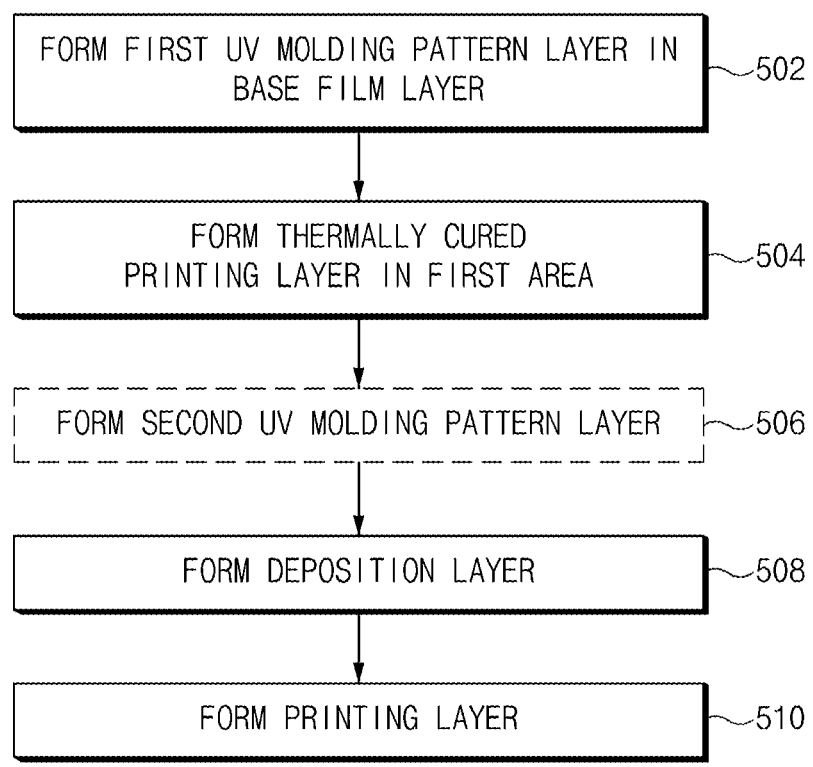
FIG. 5 is a flowchart illustrating a method for manufacturing a multilayer film according to an embodiment.

FIG. 5 is a flowchart illustrating a method for manufacturing a multilayer film according to an embodiment.

Hereinafter, referring to FIG. 5 together with FIGS. 2 and 4, a method for manufacturing the first multilayer film 310 and the second multilayer film 410 will be described.

Referring to FIG. 5, in operation 502, the first UV molding pattern layer may be formed in the base film layer. For example, referring to FIGS. 2 and 4, the first UV molding pattern layer 230 may be formed on the rear surface 220B of the base film layer 220. In an embodiment, the first UV molding pattern layer 230 may be formed by applying a UV curing liquid to the rear surface 220B of the base film layer 220, applying it to a mold having a three-dimensional pattern, and curing it by irradiating an ultraviolet ray.

In operation 504, the thermally cured printing layer may be formed in the first area. For example, referring to FIGS. 2 and 4, the thermally cured printing layer 250 may be formed on the first UV molding pattern layer 230 in the first area 10. In an embodiment, the thermally cured printing layer 250 may be formed by printing a thermal curing ink only in the first area 10 of the first UV molding pattern layer 230 through screen printing or pad printing and drying it. In an embodiment, various pigments may be applied according to a visual effect that is to be implemented through the thermally cured printing layer 250.

In operation 506, the second UV molding pattern layer may be formed. For example, referring to FIG. 4, the second UV molding pattern layer 440 may be formed in the second multilayer film 410, in which the thermally cured printing layer 250 is formed. In an embodiment, the second UV molding pattern layer 440 may be formed by applying a UV curing liquid to the second direction '2' of the thermally cured printing layer 250 and the first UV molding pattern layer 230, applying it to a mold having a three-dimensional pattern, and curing it by irradiating an ultraviolet ray. In the first multilayer film 310 illustrated in FIG. 2, operation 506 may be omitted.

In operation 508, the deposition layer may be formed. For example, referring to FIG. 2, the first deposition layer 260 may be formed in the second direction '2' of the first multilayer film 310, in which the thermally cured printing layer 250 is formed. For example, referring to FIG. 4, the second deposition layer 460 may be formed in the second direction '2' of the second multilayer film 410, in which the second UV molding pattern layer 440 is formed. In an embodiment, the first deposition layer 260 and the second deposition layer 460 may be formed through a deposition process, such as an electron-beam (E-beam) or sputtering. In an embodiment, the first deposition layer 260 and the second deposition layer 460 may include at least one layer. For example, the first deposition layer 260 and the second deposition layer 460 may include one or a plurality of layers, in which one material is deposited as a target, and may include a plurality of layers, in which different materials are deposited as targets. In an embodiment, according to a visual effect that is to be implemented through the first deposition layer 260 and the second deposition layer 460, a kind of a target material, the number of layers, and/or thicknesses of the layers may be changed.

In operation 510, the printing layer may be formed. For example, referring to FIG. 2, the first printing layer 270 may be formed in the second direction '2' of the first multilayer film 310, in which the first deposition layer 260 is formed. For example, referring to FIG. 4, the second printing layer 470 may be formed in the second direction '2' of the second multilayer film 410, in which the second deposition layer 460 is formed. In an embodiment, the first printing layer 270 and the second printing layer 470 may be formed through screen printing or pad printing. In an embodiment, a process of printing the first printing layer 270 and the second printing layer 470 in the same color or difference colors according to a thickness and/or a color of the first printing layer 270 and the second printing layer 470 may be repeatedly performed.

In an embodiment, the first multilayer film 310 having the first printing layer 270 and the second multilayer film 410 having the second printing layer 470 may be attached to the second surface 210B of the cover 210. In an embodiment, when the cover 210 includes a resin, the first multilayer film 310 and the second multilayer film 410 may be cut along a border of the cover 210 after being attached, and in another embodiment, they may be cut according to a shape of the cover 210 and may be attached when the cover 210 includes glass. However, the disclosure is not limited thereto.

In an embodiment, a cleaning process may be performed after the first multilayer film 310 and the second multilayer film 410 are attached to the cover 210, and thereafter, a performance inspection may be performed. The performance inspection, for example, may include a current flow inspection, an X-cutting inspection for testing an attachment force, and/or a dyne pen test for a surface tension test.

A method for manufacturing a multilayer film according to the above-described embodiment may include an operation (e.g., operation 502 of FIG. 5) of forming a first UV molding pattern layer (e.g., the first UV molding pattern layer 230 of FIG. 2 or 4) on a film layer (e.g., the base film layer 220 of FIG. 2), wherein the first UV molding pattern layer includes a first area (e.g., the first area 10 of FIG. 2 or 4) and a second area (e.g., the second area 20 of FIG. 2 or 4) that is different from the first area, an operation (e.g., operation 504 of FIG. 5) of forming a thermally cured printing layer (e.g., the thermally cured printing layer 250 of FIG. 2 or 4) on the first UV molding pattern layer in the first area, and an operation (e.g., operation 506 or 508 of FIG. 5) of forming a second UV molding pattern layer (e.g., the second UV molding pattern layer 440 of FIG. 4) or a first deposition layer (e.g., the first deposition layer 260 of FIG. 2) on the thermally cured printing layer and on the first UV molding pattern layer in the second area.

The method for manufacturing the multilayer film according to an embodiment may include an operation (e.g., operation 508 of FIG. 5) of forming a second deposition layer (e.g., the second deposition layer 460 of FIG. 4) on the second UV molding pattern layer, and an operation (e.g., operation 510 of FIG. 5) of forming a printing layer (e.g., the second printing layer 470 of FIG. 4) on the second deposition layer.

The method for manufacturing the multilayer film according to an embodiment may include an operation (e.g., 510 of FIG. 5) of forming a printing layer (e.g., the first printing layer 270 of FIG. 2) on the first deposition layer.

Figure 6:
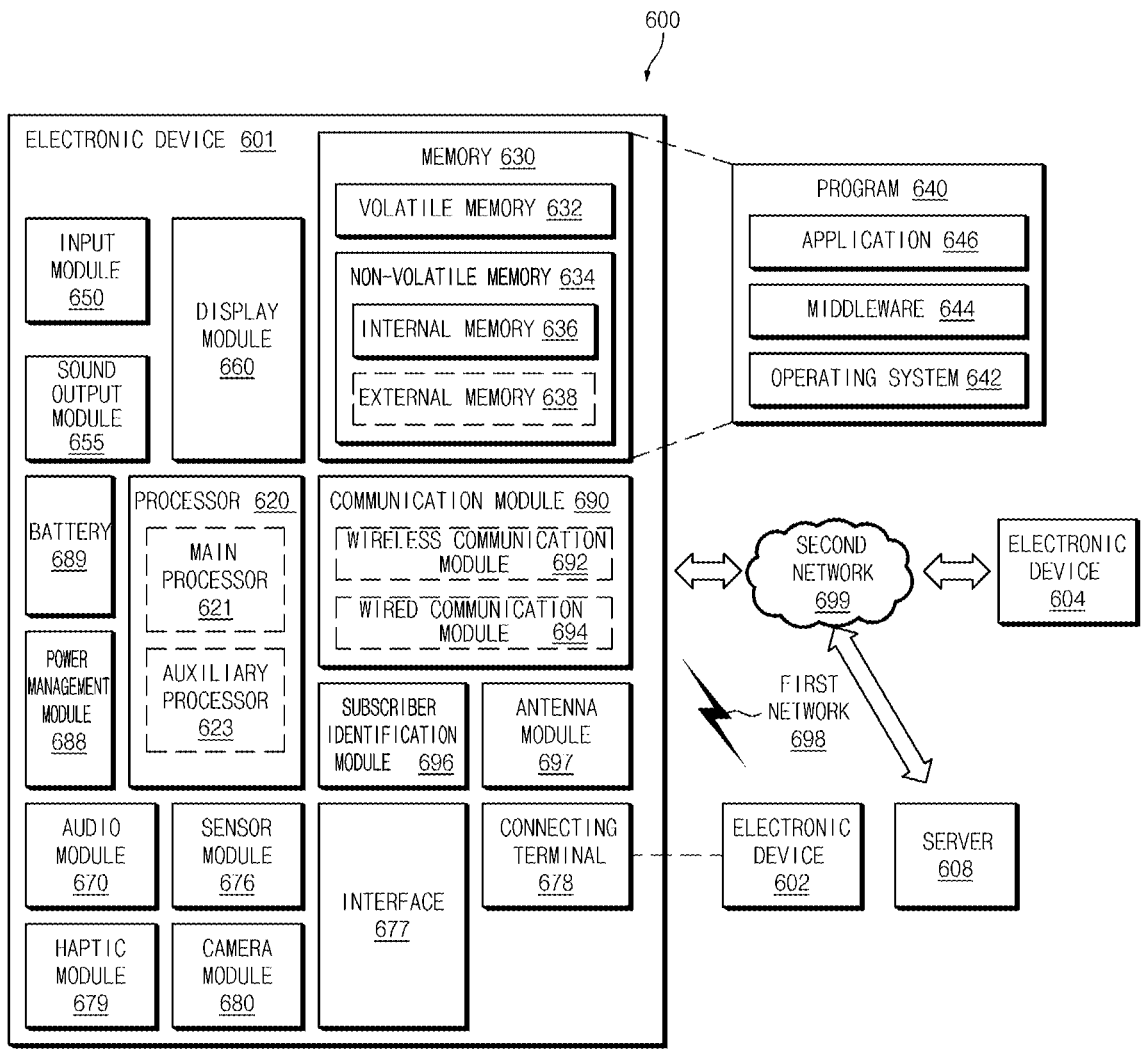
FIG. 6 is a block diagram illustrating an electronic device in a network environment according to various embodiments.

FIG. 6 is a block diagram illustrating an electronic device 601 in a network environment 600 according to various embodiments.

Referring to FIG. 6, the electronic device 601 in the network environment 600 may communicate with an electronic device 602 via a first network 698 (e.g., a short-range wireless communication network), or at least one of an electronic device 604 or a server 608 via a second network 699 (e.g., a long-range wireless communication network). According to an embodiment, the electronic device 601 may communicate with the electronic device 604 via the server 608. According to an embodiment, the electronic device 601 may include a processor 620, memory 630, an input module 650, a sound output module 655, a display module 660, an audio module 670, a sensor module 676, an interface 677, a connecting terminal 678, a haptic module 679, a camera module 680, a power management module 688, a battery 689, a communication module 690, a subscriber identification module(SIM) 696, or an antenna module 697. In some embodiments, at least one of the components (e.g., the connecting terminal 678) may be omitted from the electronic device 601, or one or more other components may be added in the electronic device 601. In some embodiments, some of the components (e.g., the sensor module 676, the camera module 680, or the antenna module 697) may be implemented as a single component (e.g., the display module 660).

The processor 620 may execute, for example, software (e.g., a program 640) to control at least one other component (e.g., a hardware or software component) of the electronic device 601 coupled with the processor 620, and may perform various data processing or computation. According to one embodiment, as at least part of the data processing or computation, the processor 620 may store a command or data received from another component (e.g., the sensor module 676 or the communication module 690) in volatile memory 632, process the command or the data stored in the volatile memory 632, and store resulting data in non-volatile memory 634. According to an embodiment, the processor 620 may include a main processor 621 (e.g., a central processing unit (CPU) or an application processor (AP)), or an auxiliary processor 623 (e.g., a graphics processing unit (GPU), a neural processing unit (NPU), an image signal processor (ISP), a sensor hub processor, or a communication processor (CP)) that is operable independently from, or in conjunction with, the main processor 621. For example, when the electronic device 601 includes the main processor 621 and the auxiliary processor 623, the auxiliary processor 623 may be adapted to consume less power than the main processor 621, or to be specific to a specified function. The auxiliary processor 623 may be implemented as separate from, or as part of the main processor 621.

The auxiliary processor 623 may control at least some of functions or states related to at least one component (e.g., the display module 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). According to an embodiment, the auxiliary processor 623 (e.g., an image signal processor or a communication processor) may be implemented as part of another component (e.g., the camera module 680 or the communication module 690) functionally related to the auxiliary processor 623. According to an embodiment, the auxiliary processor 623 (e.g., the neural processing unit) may include a hardware structure specified for artificial intelligence model processing. An artificial intelligence model may be generated by machine learning. Such learning may be performed, e.g., by the electronic device 601 where the artificial intelligence is performed or via a separate server (e.g., the server 608). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 630 may store various data used by at least one component (e.g., the processor 620 or the sensor module 676) of the electronic device 601. The various data may include, for example, software (e.g., the program 640) and input data or output data for a command related thererto. The memory 630 may include the volatile memory 632 or the non-volatile memory 634.

The program 640 may be stored in the memory 630 as software, and may include, for example, an operating system (OS) 642, middleware 644, or an application 646.

The input module 650 may receive a command or data to be used by another component (e.g., the processor 620) of the electronic device 601, from the outside (e.g., a user) of the electronic device 601. The input module 650 may include, for example, a microphone, a mouse, a keyboard, a key (e.g., a button), or a digital pen (e.g., a stylus pen).

The sound output module 655 may output sound signals to the outside of the electronic device 601. The sound output module 655 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 660 may visually provide information to the outside (e.g., a user) of the electronic device 601. The display module 660 may include, for example, a display, a hologram device, or a projector and control circuitry to control a corresponding one of the display, hologram device, and projector. According to an embodiment, the display module 660 may include a touch sensor adapted to detect a touch, or a pressure sensor adapted to measure the intensity of force incurred by the touch.

The audio module 670 may convert a sound into an electrical signal and vice versa. According to an embodiment, the audio module 670 may obtain the sound via the input module 650, or output the sound via the sound output module 655 or a headphone of an external electronic device (e.g., an electronic device 602) directly (e.g., wiredly) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. According to an embodiment, the sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device (e.g., the electronic device 602) directly (e.g., wiredly) or wirelessly. According to an embodiment, the interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device (e.g., the electronic device 602). According to an embodiment, the connecting terminal 678 may include, for example, a HDMI connector, a USB connector, a SD card connector, or an audio connector (e.g., a headphone connector).

The haptic module 679 may convert an electrical signal into a mechanical stimulus (e.g., a vibration or a movement) or electrical stimulus which may be recognized by a user via his tactile sensation or kinesthetic sensation. According to an embodiment, the haptic module 679 may include, for example, a motor, a piezoelectric element, or an electric stimulator.

The camera module 680 may capture a still image or moving images. According to an embodiment, the camera module 680 may include one or more lenses, image sensors, image signal processors, or flashes.

The power management module 688 may manage power supplied to the electronic device 601. According to one embodiment, the power management module 688 may be implemented as at least part of, for example, a power management integrated circuit (PMIC).

The battery 689 may supply power to at least one component of the electronic device 601. According to an embodiment, the battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the application processor (AP)) and supports a direct (e.g., wired) communication or a wireless communication. According to an embodiment, the communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or infrared data association (IrDA)) or the second network 699 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The wireless communication module 692 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 692 may support a high-frequency band (e.g., the mmWave band) to achieve, e.g., a high data transmission rate. The wireless communication module 692 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 692 may support various requirements specified in the electronic device 601, an external electronic device (e.g., the electronic device 604), or a network system (e.g., the second network 699). According to an embodiment, the wireless communication module 692 may support a peak data rate (e.g., 20 Gbps or more) for implementing eMBB, loss coverage (e.g., 664 dB or less) for implementing mMTC, or U-plane latency (e.g., 0.5 ms or less for each of downlink (DL) and uplink (UL), or a round trip of 6*ms* or less) for implementing URLLC.

The antenna module 697 may transmit or receive a signal or power to or from the outside (e.g., the external electronic device) of the electronic device 601. According to an embodiment, the antenna module 697 may include an antenna including a radiating element composed of a conductive material or a conductive pattern formed in or on a substrate (e.g., a printed circuit board (PCB)). According to an embodiment, the antenna module 697 may include a plurality of antennas (e.g., array antennas). In such a case, at least one antenna appropriate for a communication scheme used in the communication network, such as the first network 698 or the second network 699, may be selected, for example, by the communication module 690 (e.g., the wireless communication module 692) from the plurality of antennas. The signal or the power may then be transmitted or received between the communication module 690 and the external electronic device via the selected at least one antenna. According to an embodiment, another component (e.g., a radio frequency integrated circuit (RFIC)) other than the radiating element may be additionally formed as part of the antenna module 697.

According to various embodiments, the antenna module 697 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 601 and the external electronic device 604 via the server 608 coupled with the second network 699. Each of the electronic devices 602 or 604 may be a device of a same type as, or a different type, from the electronic device 601. According to an embodiment, all or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, mobile edge computing (MEC), or client-server computing technology may be used, for example. The electronic device 601 may provide ultra low-latency services using, e.g., distributed computing or mobile edge computing. In another embodiment, the external electronic device 604 may include an internet-of-things (IoT) device. The server 608 may be an intelligent server using machine learning and/or a neural network. According to an embodiment, the external electronic device 604 or the server 608 may be included in the second network 699. The electronic device 601 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 640) including one or more instructions that are stored in a storage medium (e.g., internal memory 636 or external memory 638) that is readable by a machine (e.g., the electronic device 601). For example, a processor (e.g., the processor 620) of the machine (e.g., the electronic device 601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a cover forming a portion of an exterior of the electronic device;
a film layer attached to a first surface of the cover;
at least one ultraviolet (UV) molding pattern layer disposed on the film layer, wherein the at least one UV molding pattern layer includes a first area, and a second area that is different from the first area;
a thermally cured printing layer disposed on the at least one UV molding pattern layer in the first area; and
a deposition layer including:
a first part disposed to overlap the first area of the at least one UV molding pattern layer, and
a second part interfaced with the at least one UV molding pattern layer including a pattern in the second area.

2. The electronic device of claim 1, wherein the thermally cured printing layer is not disposed on the at least one UV molding pattern layer in the second area.

3. The electronic device of claim 1, wherein:
the at least one UV molding pattern layer includes a first UV molding pattern layer,
the first part of the deposition layer is formed on the thermally cured printing layer to overlap the first area, and
the second part of the deposition layer is formed on the first UV molding pattern layer in the second area and includes a corresponding pattern that interfaces with the pattern in the second area.

4. The electronic device of claim 1, wherein:
the at least one UV molding pattern layer includes a first UV molding pattern layer including a first pattern in the second area and a second UV molding pattern layer including a second pattern in the second area, and
the thermally cured printing layer is disposed, in the first area, between the first UV molding pattern layer and the second UV molding pattern layer.

5. The electronic device of claim 4, wherein the second UV molding pattern layer includes:
a first part corresponding to the first area and disposed on the thermally cured printing layer; and
a second part corresponding to the second area, extending from the first part, and disposed on the first UV molding pattern layer.

6. The electronic device of claim 5, wherein:
the first part of the deposition layer is formed on the first part of the second UV molding pattern layer corresponding to the first area, and
the second part of the deposition layer is formed on the second part of the second UV molding pattern layer corresponding to the second area.

7. The electronic device of claim 6, comprising:
a first printing layer formed on the deposition layer.

8. The electronic device of claim 7, comprising:
an adhesive layer interposed between the cover and the film layer.

9. The electronic device of claim 8, wherein:
a thickness of the first UV molding pattern layer is in a range from 5 μm to 15 μm,
a thickness of the second UV molding pattern layer is in a range from 5 μm to 15 μm,
a thickness of the thermally cured printing layer is in a range from 2 μm to 7 μm,
a thickness of the deposition layer is in a range from 10 nm to 700 nm, and
a thickness of the first printing layer is in a range from 2 μm to 70 μm.

10. The electronic device of claim 1, wherein the cover includes a resin or glass.

11. A cover of an electronic device, comprising:
a film layer attached to a first surface of the cover;
an adhesive layer interposed between the first surface of the cover and the film layer;
at least one UV molding pattern layer disposed on the film layer, wherein the at least one UV molding pattern layer includes a first area, and a second area that is different from the first area;
a thermally cured printing layer disposed on the at least one UV molding pattern layer in the first area;
a deposition layer including:
a first part disposed to overlap the first area of the at least one UV molding pattern layer, and
a second part interfaced with the at least one UV molding pattern layer including a pattern in the second area; and
a printing layer disposed on the deposition layer.

12. The cover of claim 11, wherein the thermally cured printing layer is not disposed on the at least one UV molding pattern layer in the second area.

13. The cover of claim 11, wherein:
the at least one UV molding pattern layer includes a first UV molding pattern layer,
the first part of the deposition layer is formed on the thermally cured printing layer to overlap the first area, and
the second part of the deposition layer is formed on the second area of the first UV molding pattern layer and includes a corresponding pattern that interfaces with the pattern in the second area of the first UV molding pattern layer.

14. The cover of claim 11, wherein:
the at least one UV molding pattern layer includes a first UV molding pattern layer including a first pattern in the second area and a second UV molding pattern layer including a second pattern in the second area, and
the thermally cured printing layer is disposed, in the first area, between the first UV molding pattern layer and the second UV molding pattern layer.

15. The cover of claim 14, wherein the second UV molding pattern layer includes
a first part corresponding to the first area and disposed on the thermally cured printing layer; and
a second part corresponding to the second area, extending from the first part, and disposed on the first UV molding pattern layer.

16. The cover of claim 15, wherein:
the first part of the deposition layer is formed on the first part of the second UV molding pattern layer corresponding to the first area, and
the second part of the deposition layer is formed on the second part of the second UV molding pattern layer corresponding to the second area.

17. The cover of claim 11, wherein the cover includes a resin or glass.

18. A method for manufacturing a multilayer film, the method comprising:
forming a first UV molding pattern layer on a film layer, wherein the first UV molding pattern layer includes a first area and a second area that is different from the first area;
forming a thermally cured printing layer on the first UV molding pattern layer in the first area; and
forming a second UV molding pattern layer or a first deposition layer interfaced with the thermally cured printing layer and interfaced with the first UV molding pattern layer including a pattern in the second area.

19. The method of claim 18, comprising:
forming a second deposition layer on the second UV molding pattern layer; and
forming a second printing layer interfaced with the second deposition layer.

20. The method of claim 18, comprising:
forming a first printing layer interfaced with the first deposition layer.

* * * * *